United States Patent
Chapelon et al.

(10) Patent No.: US 9,093,505 B2
(45) Date of Patent: Jul. 28, 2015

(54) INTEGRATED CIRCUIT CHIP AND FABRICATION METHOD

(75) Inventors: Laurent-Luc Chapelon, Domene (FR); Julien Cuzzocrea, Grenoble (FR)

(73) Assignee: STMicroelectronics (Crolles 2) SAS, Crolles Cedex (FR)

(*) Notice: Subject to any disclaimer, the term of this patent is extended or adjusted under 35 U.S.C. 154(b) by 811 days.

(21) Appl. No.: 13/304,823

(22) Filed: Nov. 28, 2011

(65) Prior Publication Data
US 2012/0146226 A1 Jun. 14, 2012

(30) Foreign Application Priority Data
Dec. 30, 2010 (FR) ..................... 10 61355

(51) Int. Cl.
*H01L 21/4763* (2006.01)
*H01L 21/768* (2006.01)
(Continued)

(52) U.S. Cl.
CPC ........ *H01L 21/76898* (2013.01); *H01L 23/481* (2013.01); *H01L 24/03* (2013.01); *H01L 24/05* (2013.01); *H01L 24/11* (2013.01); *H01L 24/13* (2013.01); *H01L 2224/0401* (2013.01); *H01L 2224/0501* (2013.01); *H01L 2224/0502* (2013.01); *H01L 2224/0556* (2013.01); *H01L 2224/05099* (2013.01); *H01L 2224/05548* (2013.01); *H01L 2224/05556* (2013.01); *H01L 2224/05571* (2013.01); *H01L 2224/05599* (2013.01); *H01L 2224/1147* (2013.01); *H01L 2224/13111* (2013.01); *H01L 2224/13147* (2013.01); *H01L 2224/13565* (2013.01); *H01L 2224/13657* (2013.01);
(Continued)

(58) Field of Classification Search
CPC .................. H01L 21/76843; H01L 21/76838; H01L 21/76877; H01L 21/76895; H01L 21/76834; H01L 2924/00012; H01L 2224/32225; H01L 2224/48227; H01L 2224/73265; H01L 2924/00014; H01L 2224/05556; H01L 2224/05571
USPC ......... 438/618, 642, 625, 629, 666, 667, 672; 257/E21.586, E21.575, E23.141
See application file for complete search history.

(56) References Cited

U.S. PATENT DOCUMENTS 7,646,100 B2 * 1/2010 Kameyama et al. .......... 257/774
8,492,263 B2 * 7/2013 Wang et al. ................... 438/614
(Continued)

FOREIGN PATENT DOCUMENTS

| EP | 1482553 A2 | 12/2004 |
|---|---|---|
| JP | 2005260079 A | 9/2005 |
| WO | WO-2007146478 A1 | 12/2007 |

OTHER PUBLICATIONS

French Search Report and Written Opinion for FR 1061355 dated Aug. 12, 2011 (9 pages).

*Primary Examiner* — Michelle Mandala
(74) *Attorney, Agent, or Firm* — Gardere Wynne Sewell LLP

(57) ABSTRACT

An integrated circuit chip includes a substrate die and integrated circuits and a layer incorporating a front electrical interconnect network formed on a front face of the substrate die. A local electrical connection via made of an electrically conductive material is formed in a hole of the substrate die. The via is linked to a connection portion of the electrical interconnect network. An electrical connection pillar made of an electrically conductive material is formed on a rear part of the electrical connection via. A local external protection layer at least partly covers the electrical connection via and the electrical connection pillar.

15 Claims, 6 Drawing Sheets

(51) Int. Cl.
*H01L 23/48* (2006.01)
*H01L 23/00* (2006.01)

(52) U.S. Cl.
CPC ............... *H01L 2924/00014* (2013.01); *H01L 2924/014* (2013.01); *H01L 2924/0105* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01079* (2013.01)

(56) References Cited

U.S. PATENT DOCUMENTS

| | | | |
|---|---|---|---|
| 2001/0032783 A1* | 10/2001 | Gopalraja et al. | 204/298.18 |
| 2010/0078770 A1 | 4/2010 | Purushothaman et al. | |
| 2010/0182040 A1 | 7/2010 | Feng et al. | |
| 2010/0246152 A1 | 9/2010 | Lin et al. | |
| 2011/0254160 A1 | 10/2011 | Tsai et al. | |
| 2011/0260317 A1* | 10/2011 | Lu et al. | 257/737 |
| 2011/0315526 A1 | 12/2011 | Jahnes et al. | |

* cited by examiner

INTEGRATED CIRCUIT CHIP AND FABRICATION METHOD

PRIORITY CLAIM

This application claims priority from French Application for Patent No. 1061355 filed Dec. 30, 2010, the disclosure of which is hereby incorporated by reference.

TECHNICAL FIELD

The present invention relates to the field of semiconductor devices and, more particularly, that of integrated circuit chips and their fabrication methods.

BACKGROUND

Integrated circuit chips are known which are provided with electrical connection means which comprise electrical connection vias for passing through the substrate on a front face of which are formed the integrated circuits, in order to produce electrical connections at the rear, that is to say, opposite the side where the integrated circuits are situated, these electrical connection vias being provided with rear electrical connection pillars. The rear face of the substrate and the vias are covered with a permanent passivation layer made of a photosensitive polymer, through which the rear electrical connection pillars are formed by using non-permanent conductive layers on this passivation layer. Consequently, the fabrication methods implemented comprise a large number of steps in particular because of the existence of the passivation layer. Furthermore, the passivation layer cannot completely fill the central hole remaining in the vias even though there is a risk of internal oxidation of the electrical connection vias.

SUMMARY

According to one implementation, a fabrication method is proposed that at least partly avoids the abovementioned drawbacks.

A method for producing an electrical connection means of an integrated circuit chip is proposed that comprises a substrate die and, on a front face of the substrate die, integrated circuits and a layer incorporating a front electrical interconnect network.

The proposed method may comprise: producing at least one local electrical connection via made of an electrically conductive material, passing through the substrate die and linked to a connection portion of said electrical interconnect network; producing an electrical connection pillar made of an electrically conductive material, on a rear portion of the electrical connection via; and producing an external local protection layer at least partly covering the electrical connection via and the electrical connection pillar.

The proposed method may comprise: producing a hole through the substrate die via its rear face, revealing a connection portion of said electrical interconnect network; producing, by a physical vapor phase deposition (PVD), a thin layer made of an electrically conductive material, above the rear face of the substrate die and the wall and the bottom of the hole; producing, by a local electrochemical deposition with electrical contact on said thin layer, a local thick layer made of an electrically conductive material on the thin layer, in the hole and above the rear face of the substrate die; producing, by a local electrochemical deposition with electrical contact on said thin layer, a rear electrical connection pillar on the thick layer; and removing the thin layer around the thick layer, the remaining portion of the thin layer and the thick layer forming an electrical connection via linked to said front interconnect network and provided with the rear electrical connection pillar.

The method may comprise: producing, by a chemical deposition, an external local protection layer at least partly covering the electrical connection via and the rear electrical connection pillar.

The method may comprise, before producing the thin layer: producing an insulating layer on the rear face of the substrate die and against the walls of the hole; and removing a part of the insulating layer situated above said connection portion of the front electrical interconnect network.

The method may comprise: producing the insulating layer by a sub-atmospheric chemical vapor phase deposition (SACVD).

According to one embodiment, there is proposed an integrated circuit chip comprising a substrate die and, on a front face of this substrate die, integrated circuits and a layer incorporating a front electrical interconnect network.

A proposed integrated circuit chip may comprise at least one rear electrical connection means comprising an electrical connection via passing through the substrate die and linked to a connection portion of said front electrical interconnect network and comprising a rear electrical connection pillar formed on the electrical connection via, and a local rear protection layer at least partly covering the electrical connection via and the electrical connection pillar.

The electrical connection pillar may be provided, on its end, with a drop of solder.

The electrical connection via and the electrical connection pillar may comprise copper (Cu) and the protection layer comprises an alloy of cobalt (Co), tungsten (W) and phosphorus (P).

BRIEF DESCRIPTION OF THE DRAWINGS

An integrated circuit chip and an integrated circuit chip fabrication method, according to a particular embodiment of the present invention, will now be described as non-limiting examples, illustrated by the drawing in which.

DETAILED DESCRIPTION OF THE DRAWINGS

Figure 1:
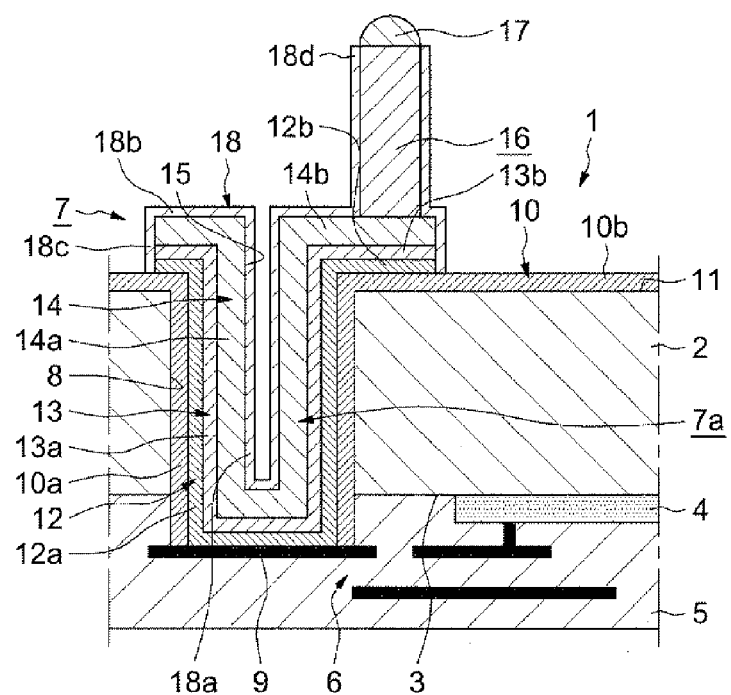
FIG. 1 represents a partial cross-section of an integrated circuit chip.

As illustrated in FIG. 1, an integrated circuit chip 1 comprises a substrate die 2, for example made of silicon, on a front face 3 of which are produced integrated circuits 4 and which is provided, on this front face 3, with a front layer 5 in which is incorporated a front electrical interconnect network 6, possibly with several metallic levels, selectively linked to the integrated circuits 4.

The integrated circuit chip 1 comprises a plurality of rear electrical connection means 7, each of which has the following structure.

Through the substrate die 2, and in a region free of integrated circuits 4, a hole 8 is formed which is prolonged (extended) in the front layer 5 to an electrical connection portion 9 of the front interconnect network 6. This connection portion 9 may be situated in the first metallic level of the front interconnect network 6.

An insulating layer 10, for example made of silicon oxide (SiO$_2$), has a part 10a which covers the lateral wall of the hole 8 and a part 10b which covers the rear face 11 of the substrate die 2.

A local electrically conductive barrier layer 12, for example made of titanium (Ti), in a bilayer of titanium nitride and titanium (TiN/Ti), of tantalum (Ta) or of a bilayer of tantalum nitride and tantalum (TaN/Ta), has a part 12a which covers the part 10a of the insulating layer 10 and the connection portion 9, in the bottom of the hole 8, and has a local part 12b which locally covers the part 10b of the insulating layer 10, over at least a part of the periphery of the hole 8.

A local electrically conductive attach layer 13, for example made of copper (Cu), has a part 13a which covers the part 12a of the barrier layer 12 and a local part 13b which covers the local part 12b of the barrier layer 12.

A thick local electrically conductive layer 14, for example made of copper (Cu), has a part 14a which covers the part 13a of the attach layer 13 and a local part 14b which covers the local part 13b of the attach layer 13. The part 14a of the thick layer 14 determines a remaining central blind hole 15 which is open towards the rear. According to a variant embodiment, the thickness of the local thick layer 14 may be sufficient to completely fill the rest of the hole 8 and thus eliminate the central blind hole 15.

An electrically conductive pillar 16, protruding towards the rear, for example made of copper (Cu) is formed on the local part 14b of the thick layer 14, this pillar being, for example, cylindrical.

On the end of the protruding pillar 16, a drop of electrically conductive solder 17 is formed, which is, for example, made of an alloy of tin and silver (SnAg) or an alloy of tin, silver and copper (SnAgCu).

Finally, a local external rear protection layer 18, for example made of an alloy of cobalt, tungsten and phosphorus (CoWP), comprises a part 18a which covers the part 14a of the thick layer 14, in the remaining hole 15, comprises a part 18b which covers the local part 14b of the thick layer 14, around the protruding pillar 16, comprises a part 18c which covers the flanks or lateral edges of the local part 14b of the thick layer 14, of the local part 13b of the layer 13 and of the local part 12, as far as the part 10b of the insulating layer 10, and comprises a part 18d which covers the peripheral face of the protruding pillar 16 and, possibly, the drop of solder 17.

Thus, each rear electrical connection means 7 comprises an electrical connection via 7a formed by the layers 12, 13 and 14 and comprises the protruding pillar 16, the end of which can be soldered to another electronic component via the drop of solder 17, this via 7a and this pillar 16 being protected against corrosion by virtue of the existence of the external protection layer 18.

With reference to FIGS. 2 to 10, there now follows a description of a method for collectively fabricating a plurality of integrated circuit chips corresponding to the integrated circuit chip 1 of FIG. 1.

Figure 2:
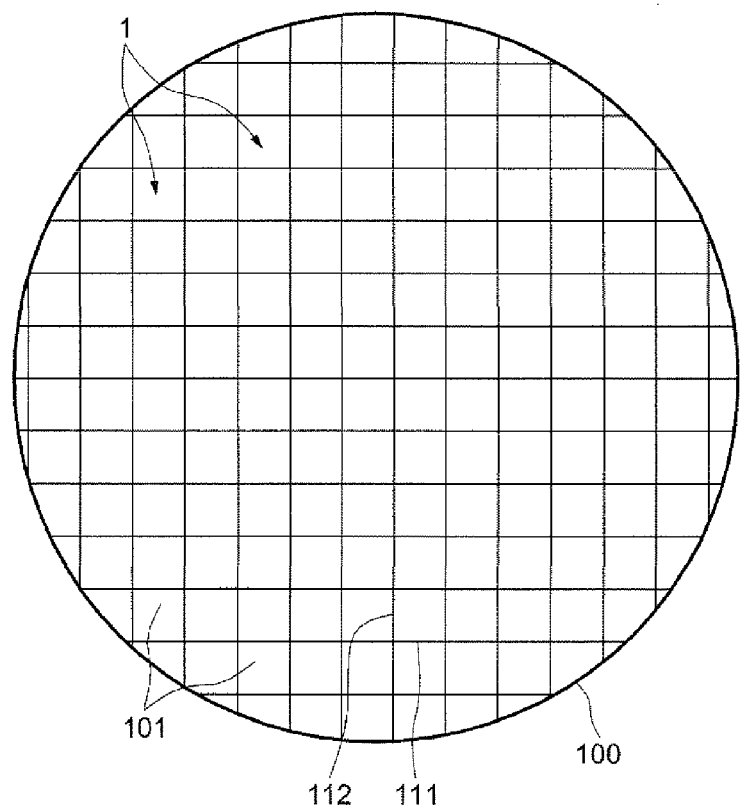
FIG. 2 represents a wafer of integrated circuit chips.

As illustrated in FIG. 2, there is, for this, a wafer 100, for example made of silicon, having a plurality or matrix of placements 101 each corresponding to an integrated circuit chip 1 to be fabricated.

Figure 3:
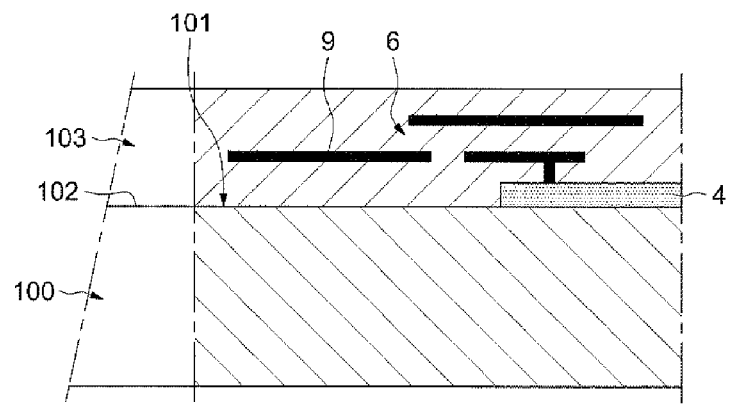
FIGS. 3 to 10 represent steps in fabricating integrated circuit chips, seen in cross section.

As illustrated in FIG. 3, integrated circuits 4 and front electrical connection network 6 are produced in a common front layer 103, on a front face 102 of the wafer 100 and respectively in the placements 101.

Figure 4:
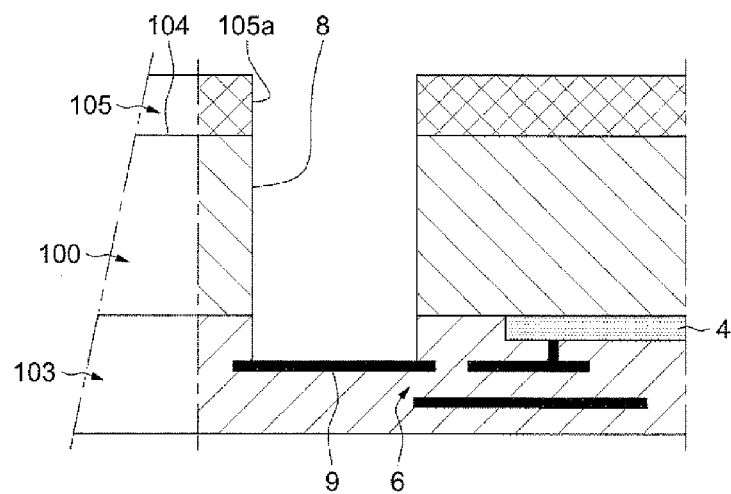

Next, as illustrated in FIG. 4, pluralities of holes 8 are produced, via the rear face 104 of the wafer 100 and respectively in the placements 101 of the chips to be fabricated, by etching through corresponding through passages 105a formed in a mask 105, and as far as portions 9 of the electrical connection networks. Then, the mask 105 is removed.

Figure 5:
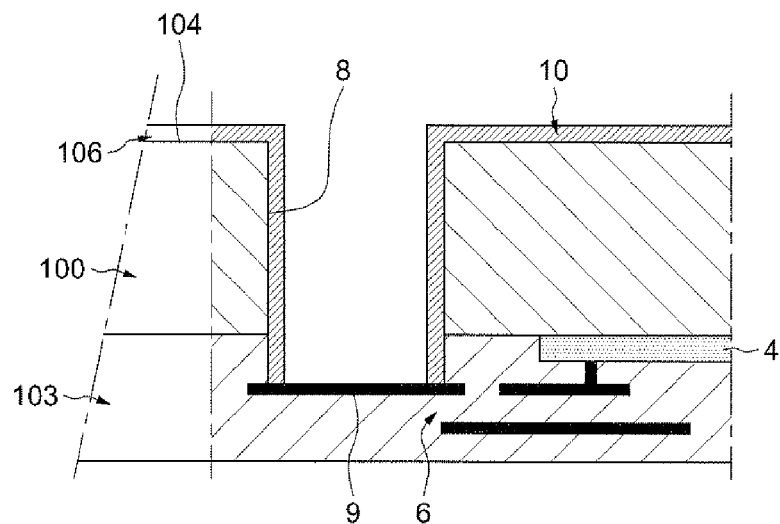

Next, as illustrated in FIG. 5, using a sub-atmospheric chemical vapor phase deposition (SACVD), an insulating layer 106 is produced on the rear face 104 and in the holes 8 of the wafer 100, and the parts of this layer 106 in the bottom of the holes 8 are removed so as to reveal the portions 9 of the front electrical connection network 6. The insulating layer 10 is thus obtained, in each of the placements 101 and for each chip to be fabricated.

According to a variant embodiment, it would be possible to produce the holes 8 close to the portions 9 of the electrical connection networks 6, in the layer 103, then deposit the insulating layer 106, then remove the parts of this layer 106 in the bottom of the holes 8 and remove the rest of the layer 103 to reveal the portions 9 of the front electrical connection networks 6.

Figure 6:
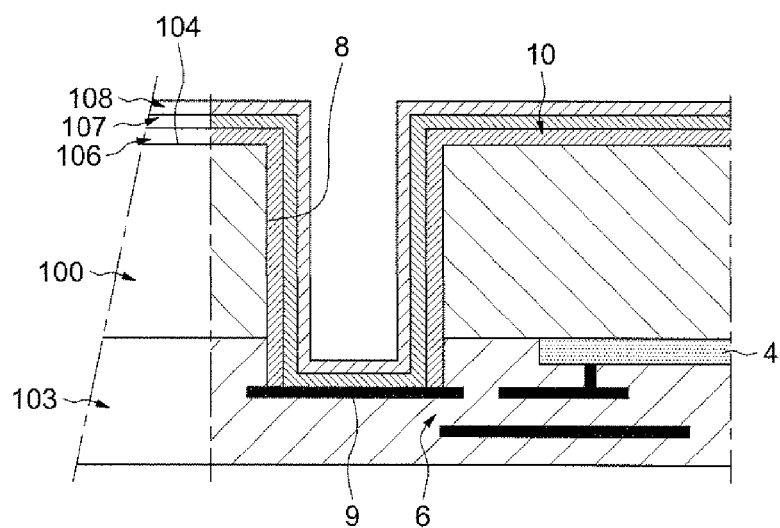

Next, as illustrated in FIG. 6, a layer 107 is produced by a physical vapor phase deposition (PVD), on the insulating layer 106 and in the bottom of the holes 8, followed by a layer 108 on this layer 107, both intended for the fabrication of the layer 12 then the layer 13 of the chips to be fabricated.

Figure 7:
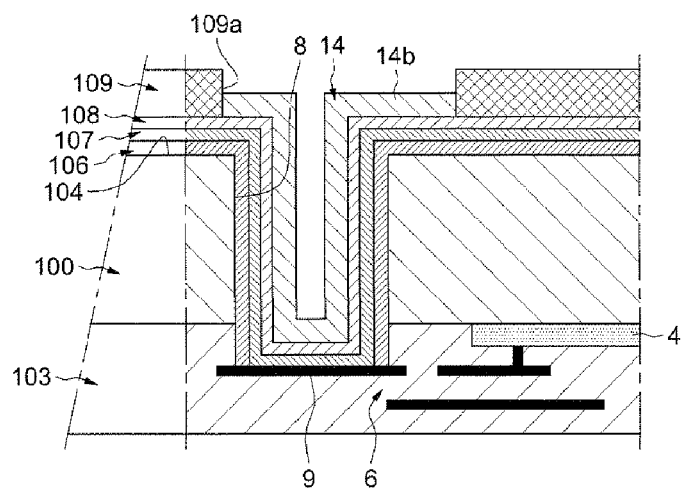

Next, as illustrated in FIG. 7, a mask 109 is formed on the layer 108, through which are formed openings 109a, the edges of which correspond to the edges of the rear parts 14b of the local layers 14 associated with the holes 8 of the chips to be fabricated. Then, an electrochemical deposition in a bath is used to produce the local layers 14 in the openings 109a of the mask 109, by making electrical contact on the peripheral edge of the layer 108, at the periphery of the wafer 100.

Figure 8:
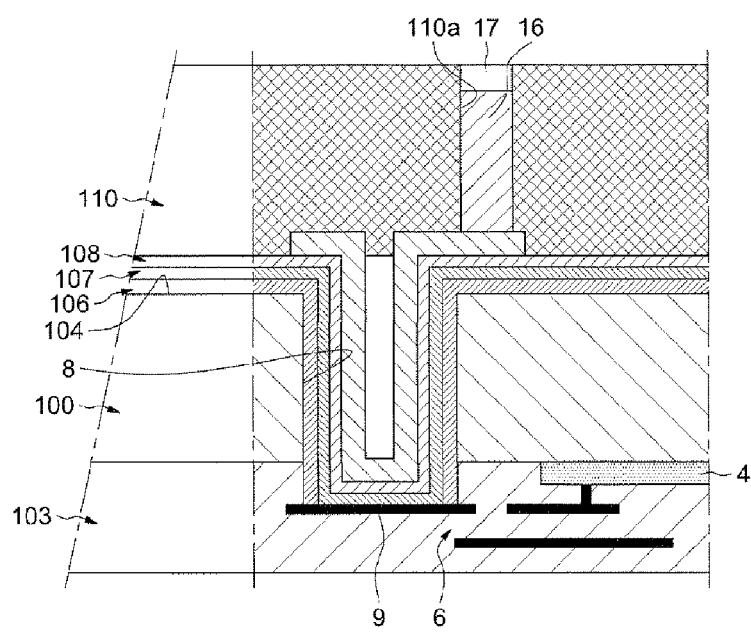

Next, as illustrated in FIG. 8, after having removed the mask 109, a new mask 110 is formed on the layer 108 and on the local layers 14, by forming, through this mask 110, through openings 110a corresponding to the pillars 16 to be produced on the rear parts 14b of the local layers 14 produced. Then, an electrochemical deposition in a bath is used to produce the pillars 16 and then the drops of solder 17 in the openings 110a of the mask 110, by making, as previously, electrical contact on the peripheral edge of the layer 108, at the periphery of the wafer 100.

Figure 9:
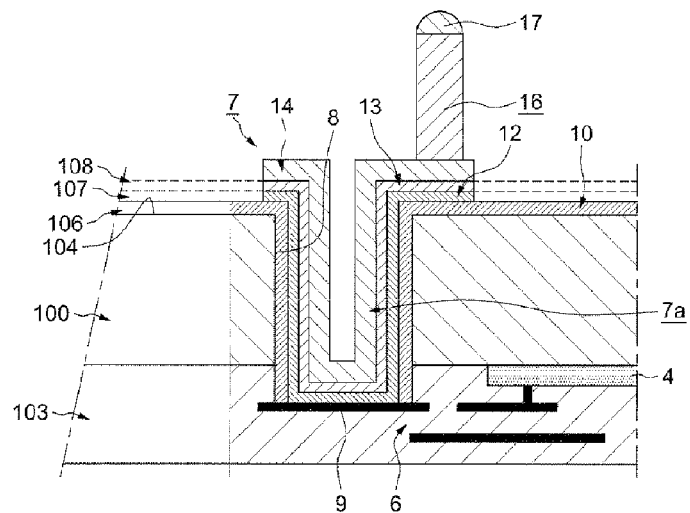

Next, as illustrated in FIG. 9, after having removed the mask 110, a wet etch in suitable baths is used to remove the parts of the layer 108 then the previous layer 107, around the rear parts 14b of the local layers 14 produced, over all the remaining surface of the insulating layer 106. Local layers 12, 13 and 14 are then obtained which are associated with each of the holes 8 of the chips to be produced.

Then, a bake is performed for the drops of solder 17 to assume the dome shape.

Thus, pluralities of local rear electrical connection means 7 are formed, in the placements 101 of the wafer 100, each comprising an electrical connection through via 7a and a protruding pillar 16 provided with a drop of solder 17.

Figure 10:
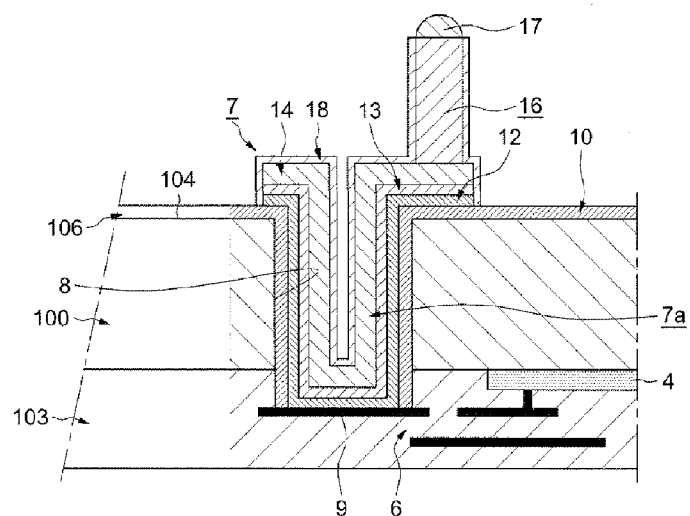

Next, as illustrated in FIG. 10, a naturally selective chemical deposition is used to produce protection layers 18 on the rear electrical connection means 7. For example, if the thick layer 14 and the protruding pillar 16 are made of copper, the protection layer 18 may be formed by a selective chemical deposition of a ternary alloy based on cobalt, tungsten and phosphorus (CoWP) according to a self-catalytic vapor phase growth method.

Next, as illustrated in FIG. 2, the integrated circuit chips 1 obtained in the placements 101 are singularized, for example by sawing along lines 111 and columns 112 separating these placements 101.

The present invention is not limited to the examples described above. Many other variant embodiments are possible, without departing from the framework defined by the appended claims.

What is claimed is:

1. A method for producing an electrical connection structure for an integrated circuit chip having a substrate die and, on a front face of the substrate die, integrated circuits and a layer incorporating a front electrical interconnect network, comprising:
producing a hole extending through the substrate die from a rear face thereof to reveal a surface of a connection portion of the front electrical interconnect network;
covering the rear face of the substrate die and side walls of the hole with an insulation layer;
producing at least one local electrical connection via in said hole made of an electrically conductive material that passes through the substrate die and is linked to the connection portion of said front electrical interconnect network;
producing an electrical connection pillar made of an electrically conductive material on a rear portion of the electrical connection via; and
producing an external local protection layer at least partly covering the electrical connection via and the electrical connection pillar.

2. The method according to claim 1, wherein the electrically conductive material is copper and the protection layer is an alloy of cobalt (Co), tungsten (W) and phosphorus (P).

3. The method according to claim 1, wherein the electrical connection pillar is in the shape of a solid cylinder.

4. A method for producing at least one electrical connection structure for an integrated circuit chip having a substrate die and, on a front face of the substrate die, integrated circuits and a layer incorporating a front electrical interconnect network, comprising:
producing a hole through the substrate die via its rear face to reveal a connection portion of said front electrical interconnect network;
producing, by a physical vapor phase deposition, a thin layer made of an electrically conductive material above the rear face of the substrate die and the wall and the bottom of the hole;
producing, by a local electrochemical deposition with electrical contact on said thin layer, a local thick layer made of an electrically conductive material on the thin layer in the hole and above the rear face of the substrate die;
producing, by a local electrochemical deposition with electrical contact on said thin layer, a rear electrical connection pillar on the thick layer;
removing the thin layer around the thick layer, a remaining portion of the thin layer and the thick layer forming an electrical connection via linked to said front interconnect network and provided with the rear electrical connection pillar.

5. The method according to claim 4, comprising:
producing, by a selective chemical deposition, an external local protection layer at least partly covering the electrical connection via and the rear electrical connection pillar.

6. The method according to claim 5, wherein the electrically conductive material is copper and the external protection layer is an alloy of cobalt (Co), tungsten (W) and phosphorus (P).

7. The method according to claim 4, further comprising, before producing the thin layer:

producing an insulating layer on the rear face of the substrate die and against the walls of the hole; and
removing a part of the insulating layer situated above said connection portion of the front electrical interconnect network.

8. The method according to claim 7, further comprising:
producing the insulating layer by a sub-atmospheric chemical vapor phase deposition.

9. The method according to claim 4, wherein the electrical connection pillar is in the shape of a solid cylinder.

10. A method, comprising:
producing a hole in a rear face of a substrate die, wherein said hole extends through the substrate die to reveal a connection portion of an electrical interconnect network mounted to a front face of the substrate die;
depositing a first layer made of an electrically conductive material on the rear face of the substrate die and on a wall and a bottom of the hole;
electrochemically depositing, with electrical contact on said first layer, a second layer made of an electrically conductive material on the first layer above the rear face of the substrate die and in said hole;
electrochemically depositing, with electrical contact on said first layer, a rear electrical connection pillar on the second layer; and
removing portions of the first layer around the second layer, wherein a remaining portion of the first and second layers forming an electrical connection via linked to said front interconnect network and a pad support the rear electrical connection pillar.

11. The method according to claim 10, further comprising depositing an external local protection layer at least partly covering the electrical connection via and the rear electrical connection pillar.

12. The method according to claim 11, wherein the electrically conductive material is copper and the external protection layer is an alloy of cobalt (Co), tungsten (W) and phosphorus (P).

13. The method according to claim 10, further comprising, before producing the first layer:
depositing an insulating layer on the rear face of the substrate die and against the wall of the hole; and
removing a part of the insulating layer situated above said connection portion of the front electrical interconnect network.

14. The method according to claim 10, wherein the electrical connection pillar is in the shape of a solid cylinder.

15. A method for producing an electrical connection structure for an integrated circuit chip having a substrate die and, on a front face of the substrate die, integrated circuits and a layer incorporating a front electrical interconnect network, comprising:
producing at least one local electrical connection via made of an electrically conductive material that passes through the substrate die and is linked to a connection portion of said front electrical interconnect network;
producing an electrical connection pillar made of an electrically conductive material on a rear portion of the electrical connection via; and
producing an external local protection layer at least partly covering the electrical connection via and the electrical connection pillar;
wherein the electrically conductive material is copper and the protection layer is an alloy of cobalt (Co), tungsten (W) and phosphorus (P).

* * * * *